United States Patent [19]
Allam et al.

[11] Patent Number: 4,755,860
[45] Date of Patent: Jul. 5, 1988

[54] AVALANCHE PHOTODETECTOR

[75] Inventors: Jeremy Allam; Federico Capasso, both of Westfield; Alfred Y. Cho, Summit, all of N.J.

[73] Assignee: American Telephone and Telegraph Company, AT&T Bell Laboratories, Murray Hill, N.J.

[21] Appl. No.: 893,357

[22] Filed: Aug. 5, 1986

[51] Int. Cl.⁴ .................. H01L 27/14; H01L 27/12
[52] U.S. Cl. .......................... 357/30; 357/4; 357/13
[58] Field of Search ............... 357/30 A, 30 E, 30 R, 357/4 SL, 13

[56] References Cited

U.S. PATENT DOCUMENTS

| 4,163,237 | 7/1979 | Dingle et al. | 357/4 |
| 4,476,477 | 10/1984 | Capasso | 357/30 |

FOREIGN PATENT DOCUMENTS 2107927  5/1983  United Kingdom .................. 357/4

OTHER PUBLICATIONS

Capasso et al., "New Avalanche Multiplication Phenomenon in Quantum Well Superlattice: Evidence of Impact Ionization Across the Band-Edge Discontinuity, Appl. Phys. Letter, 48(19), 12 May 1986, pp. 1294-1296.

A New Infrared Detector Using Electron Emission from Multiple Quantum Wells; J. S. Smith, L. C. Chiu, S. Margalit and A. Yariv, Journal of Vacuum Science & Technology B, vol. 1, No. 2, Apr.-Jun. 1983, pp. 376-378.

Primary Examiner—James W. Davie
Assistant Examiner—Georgia Y. Epps
Attorney, Agent, or Firm—Richard D. Laumann

[57] ABSTRACT

An avalanche photodetector using a quantum well superlattice in which impact ionization of carriers in the well layers occurs across the band-edge discontinuity is described.

5 Claims, 2 Drawing Sheets

AVALANCHE PHOTODETECTOR

TECHNICAL FIELD

This invention relates generally to the field of photodetectors and particularly to such photodetectors having an avalanche multiplication region.

BACKGROUND OF THE INVENTION

Many types of photodetector structures have been proposed for diverse applications including optical communication systems. For many of these applications, it is desirable that the photodetector structure exhibit gain without the need for external, electrical amplifiers. Two well known types of photodetector structures that exhibit gain are photoconductors and avalanche photodetectors.

In addition to exhibiting gain, an avalanche photodetector should have relatively low noise associated with the avalanche multiplication process, i.e., the avalanche process should not reduce photodetector sensitivity by increasing noise. In silicon avalanche photodetectors, low noise avalanche multiplication is relatively easy to achieve as the ratio of the ioization coefficients for electrons and holes useful at wavelengths longer than 1.0 $\mu$m and other materials must be used at such wavelengths. However, in avalanche photodetectors using Group III-V compound semiconductors and structures analogous to those used for silicon, the ratio of the ionization coefficients for holes and electrons is typically close to unity, and the noise associated with the avalanche multiplication process is large. That is, the ratio of the ionization coefficients for bulk Group III-V compound semiconductors is typically close to unity.

Various structures have been disclosed in attempts to reduce the noise associated with the avalanche process in avalanche photodetectors using compound semiconductors. One such photodetector is described in U.S. Pat. No. 4,476,477 issued on Oct. 9, 1984 to Capasso, Tsang and Williams. This photodetector, commonly termed a staircase by those skilled in the art, uses the energy imparted to carriers as they cross energy band discontinuities to impact ionize and produce avalanche multiplication. As the discontinuity occurs primarily in one energy band, only one type of carrier impact ionizes and, consequently, the noise associated with the avalanche process is relatively low. The structures described used a graded, i.e., varying, bandgap to obtain the required energy band profile.

Other types of photodetector structures have been proposed including several using superlattices. A superlattice is a structure having a periodicity which differs from that of the underlying crystal lattice. That is, a superlattice may be viewed as comprising interleaved layers of compositions A and B. If one layer, e.g., that with composition A, is sufficiently small, quantum effects are significant and the device may be called a quantum well structure. An exemplary photodetector using such a structure is described in *The Journal of Vacuum Science and Technology*, B1, pp. 376-378, April-June, 1983. The structure described had interleaved layers of GaAs and GaAlAs which were uniformly doped n-type. The GaAs quantum wells and barrier layers were between n-type $Ga_{0.6}Al_{0.4}As$ cladding layers. The device was operated at a sufficiently low temperature so that essentially all the electrons were trapped in the quantum wells. Application of a bias voltage to an unilluminated structure did not result in significant current flow as there were few carriers present outside the quantum wells. The bias was applied perpendicular to the quantum wells, i.e., to the two cladding layers. However, when the device was illuminated and photons absorbed in the quantum wells, electrons were excited from the wells and current flowed in the external circuit, if the photons had energy sufficient to excite electrons from the wells. This device may thus be thought of as a particular type of photoconductor.

The analysis given by the authors is interesting because they found substantial photoconductive gain, approximately 10,000, but also an exceedingly slow device response time of approximately one second which was determined by the electron capture time. There were other effects, including a possible avalanche multiplication effect, mentioned, the significance, and indeed the presense, of which the authors were not certain. For the particular effect just mentioned, it was hyposthesized that electrons traveling perpendicular to the quantum wells might scatter electrons from within the wells. However, the effects of such an avalanche process were neither described nor observed by the authors.

SUMMARY OF THE INVENTION

An avalanche photodetector comprising interleaved first and second layers, said first and second layers comprising first and second semiconductors having first and second bandgaps, said first bandgap being less than said second bandgap, the superlattice so formed being disposed between first and second cladding layers and a source of carriers to said layers having said first bandgap is described. The layers having first and second bandgaps may be conveniently termed well and barrier layers respectively. The photodetector is operated with a bias voltage small enough so that there is no tunneling or thermionic emission from the well layers but large enough so that carriers in the barrier layers impact ionize carriers in the well layers. The first layers are desirably sufficiently thin so that quantum effects are significant although this is not critical. The first and second cladding layers may have first and second conductivity types, respectively. In another embodiment, the device is a unipolar device, and the cladding layers have the same conductivity types but the layers having the first bandgap are doped. That is, the well layers are doped. In yet another embodiment, there is an electrical contact to the layers having the first bandgap to provide the carriers. This decreases the device response time.

For reasons of clarity, the elements of the devices depicted are not drawn to scale.

DETAILED DESCRIPTION

Figure 1:
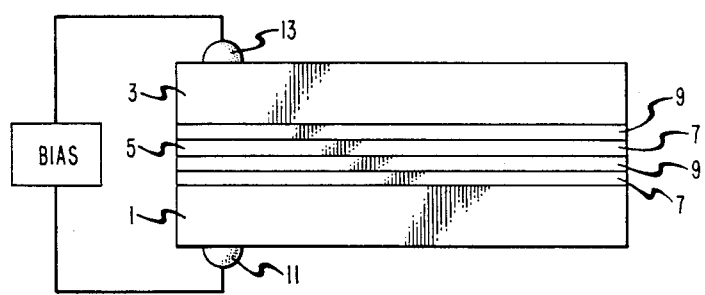
FIG. 1 is a schematic representation of an embodiment of this invention.

An exemplary embodiment of a photodetector according to our invention is schematically depicted in FIG. 1. Depicted are first and second cladding layers 1 and 3 and superlattice 5 which is between the first and second cladding layers. superlattice 5 comprises interleaved layers 7 and 9, respectively, having first and second compositions. For reasons of clarity, not all layers are shown. Layers 7 and 9 have first and second bandgaps, respectively, with the first bandgap being less that the second bandgap. Layers 7 are desirably sufficiently thin so that quantum effects are significant although this is not essential for successful device operation.

There are also electrical contacts 11 and 13 to cladding layers 1 and 3, respectively. These are connected to a bias source. The narrow bandgap, i.e., first, layers may be doped or undoped and the cladding layers may have the same or opposite conductivity types. However, there must be carriers present in the narrow bandgap layers for the device to operate successfully. If the superlattice layers are undoped, thermal generation must be adequate to yield the requisite number of carriers in the narrow bandgap layers. Thermal generation thus acts as a source of carriers in the narrow bandgap layers. The bias applied to contacts 11 and 13 must be within a critical range to yield the desired avalanche characteristics. In particular, the bias must be large enough so that the carriers in the barrier layers acquire sufficient energy to impart ionize carriers out of the well layers. However, it must also be small enough so that there is not a significant amount of either tunneling or thremionic emission from the well layers.

In an exemplary embodiment, the first and second cladding layers had opposite conductivity types and the superlattice comprised $Al_{0.48}In_{0.52}As$ layers interleaved with $Ga_{0.47}In_{0.53}As$ layers. The cladding layers were $Ga_{0.47}In_{0.53}As$ and were lattice matched to an InP substrate. Another embodiment comprised an AlSb/GaSb superlattice. Well widths varied from 100 to 400 Angstroms, and the widths of the barrier layers varied between 100 and 400 Angstroms also. Other Group III–V compound semiconductors may also be used.

Figure 2:
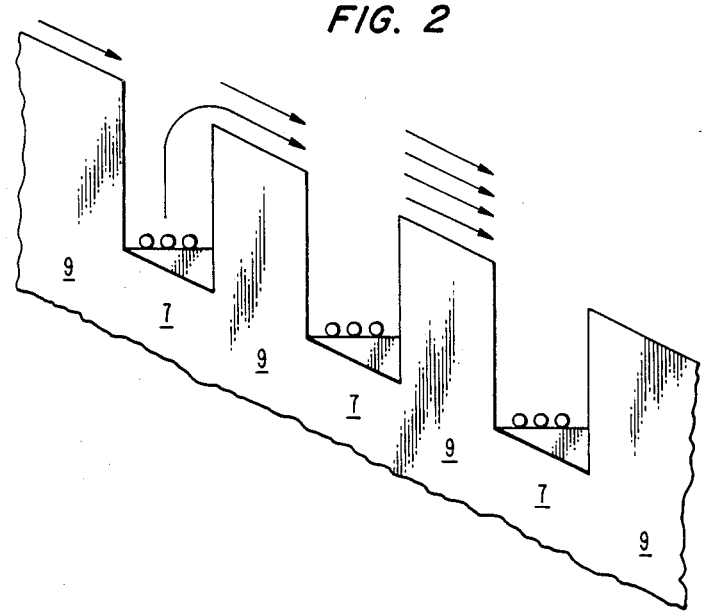
FIG. 2 is the energy band diagram of an embodiment of this invention.

FIG. 2 shows the energy band diagram for the superlattice region of an exemplary embodiment in which the wells layers are doped n-type. As depicted, a single hot electron gaining energy in the first barrier layer impact ionizes a bound electron out of the first well yielding two carriers in the second barrier layer. Each of these carriers impact ionizes in the second well to yield four carriers in the next barrier layers, etc.

Figure 3:
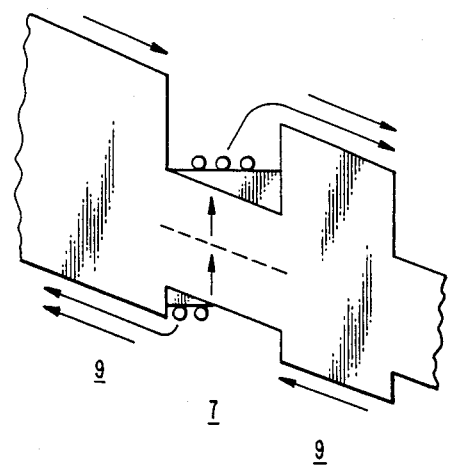
FIG. 3 has the energy band diagram for yet another embodiment of this invention.

FIG. 3 shows the energy band diagram for a portion of the superlattice region in which the wells are undoped and ionization across the band-edge discontinuity of carriers dynamically stored in the wells occurs. The carriers orginate from a thermal generation process via mid gap centers.

Figure 4:
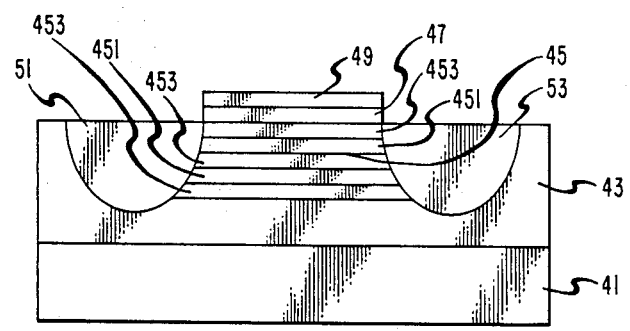
FIG. 4 is a schematic representation of yet another embodiment of this invention.

Alternatively, the well layers maybe contacted directly to yield a three terminal device. The third electrical contact provides a source of carriers to the well layers. This embodiment is depicted in FIG. 4. Depicted are n+ substrate 41, n− layers 43, n-type absorbing layer 47, n+ contact layer 49, n+ contacts 51 and 53, and a superlattice comprising alternating layers 451 and 453. The bandgap structure of the superlattice has already been described. The contacts may be formed by, for example, diffusion, ion implantation or epitaxial regrowth. The contact should be ohmic to the low bandgap layers. This type of contact is relatively easy to obtain because of the carrier concentration in the low bandgap layers.

Of course, layers having the opposite conductivity types may be used. The diodes were cooled and illuminated with either chopped light from a monochrometer or a helium neon laser. As the reverse bias was increased to 20 V, a substantial increase in the photocurrent response was observed. This increase was shown to be the result of a multiplication process. It was also observed that as the bias increased, the spectral response was enhanced more at longer wavelengths. This indicates that holes are multiplied significantly more than are electrons. It was also noted that multiplication began to occur at an electric field which is a factor of approximately two smaller than the threshold field for impact ionization across the bandgap in bulk $Ga_{0.47}In_{0.53}As$ at the same temperature. This clearly indicates that multiplication is caused by a type of impact ionization collision which differs from that of the bulk material.

As the sample temperature was increased from 70 to 300 degrees K, the onset of avalanche gain shifted to lower voltages. This shift precludes the possiblity of band-to-band impact ionization. However, the frequency dependence of the gain indicates the presence of a relatively long time constant and strongly suggests that the multiplication is due to presence of the well layers. In fact, deep level ionization can be ruled out as being unlikely.

Thus, impact ionization across the band-edge discontinuity of carriers dynamically stored in the quantum wells is the source of the observed phenomena. In the steady state, the flux of carriers entering any well must balance the flux of carriers leaving the well due to the thermionic emission. When this is achieved, it is apparent that if the band offset is sufficiently larger than the carrier temperature, considerd in terms of energy units, the carrier densities in the well layers will be greater by orders of magnitude that the values that are normally obtained in the absence of well layers for the same dark current level. This leads to carrier concentrations in the wells in excess of $10^{15}/cm^3$ for microampere dark currents. If a hole is now photo-injected into the structure and gains energy in the barrier layers, it impact ionizes one of the holes stored in the low bandgap layers out of the well and across the valence band discontinuity. The ionization threshold energy for this process is greater than $2\Delta E_v$. The ionization rate is proportional to the hole density in the wells which in turn is proportional to the dark current and increases strongly with temperature. Since the conduction band discontinuity is larger than the valence band discontinuity the electron ionization rate is smaller than the hole ionization rate.

The reservoir of carriers must be continuously replenished to sustain the avalanche process. This may occur via thermal generation of electron-hole pairs in the wells. The time constant can be very long at low temperatures and determines the role of the multiplication curve as a function of chopping frequency.

What is claimed is:

1. An avalanche photodetector comprising first and second cladding layers and disposed therebetween a superlattice comprising interleaved layers having first and second semiconductor compositions and first and second bandgaps, respectively, said first bandgap being less than said second bandgap; first and second electrical contacts to said first and second cladding layers, respectively; a source of carriers in said layer having said first bandgap; and means for biasing small enough so that there is no tunneling or thermionic emission of carriers from said layers having said first bandgap and large enough so that carriers impact ionize carriers in said layers having said first bandgap.

2. A photodetector is recited in claim 1 in which said cladding layers have the same conductivity type.

3. A photodetector as recited in claim 1 in which said cladding layers have the opposite conductivity type.

4. A photodetector as recited in claim 1 further comprising a third electrical contact to said first bandgap layers.

5. A photodetector as recited in claim 1 in which said semiconductors compositions are selected from the group consisting of Group III-V compound semiconductors.

* * * * *